United States Patent
Heo et al.

(10) Patent No.: US 11,926,759 B2
(45) Date of Patent: Mar. 12, 2024

(54) WINDOW, METHOD OF MANUFACTURING WINDOW, AND DISPLAY DEVICE INCLUDING WINDOW

(71) Applicant: Samsung Display Co., Ltd., Yongin-si (KR)

(72) Inventors: Jin Nyoung Heo, Yongin-si (KR); Kilsung Lee, Gwacheon-si (KR); Hoseok Sohn, Seoul (KR); Yongseok Lee, Suwon-si (KR); Dong Woon Lee, Yongin-si (KR); Yusik Jeon, Hwaseong-si (KR); Beomgyu Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/732,030

(22) Filed: Dec. 31, 2019

(65) Prior Publication Data

US 2020/0208013 A1 Jul. 2, 2020

(30) Foreign Application Priority Data

Jan. 2, 2019 (KR) .................. 10-2019-0000284

(51) Int. Cl.
*G02B 1/11* (2015.01)
*C03C 17/00* (2006.01)
(Continued)

(52) U.S. Cl.
CPC .......... *C09D 183/08* (2013.01); *C03C 17/007* (2013.01); *C03C 17/009* (2013.01);
(Continued)

(58) Field of Classification Search
CPC .. G02B 1/10; G02B 1/11; G02B 1/111; G02B 1/14; G02B 1/18; C03C 2217/75; C03C 2217/76; C03C 17/006–009; C03C 17/28–328; C03C 17/34; C03C 17/3405; C03C 17/42; C09D 5/006;
(Continued)

(56) References Cited

U.S. PATENT DOCUMENTS 8,940,805 B2    1/2015  Shim et al.
9,657,178 B2    5/2017  Cho et al.
(Continued)

FOREIGN PATENT DOCUMENTS

CN    101194187    5/2008
CN    102933663    2/2013
(Continued)

OTHER PUBLICATIONS

Machine translation of JP 2011/088787 A, obtained from J-PlatPat service of the JPO (Year: 2021).*

(Continued)

*Primary Examiner* — Z. Jim Yang
(74) *Attorney, Agent, or Firm* — H.C. Park & Associates, PLC

(57) ABSTRACT

A window includes a base layer and a first coating layer. The first coating layer is disposed on a first surface of the base layer. The first coating layer is a single layer. The first coating layer includes a siloxane-based compound. The siloxane-based compound includes fluorine and silica.

29 Claims, 10 Drawing Sheets

(51) Int. Cl.
*C03C 17/30* (2006.01)
*C09D 7/40* (2018.01)
*C09D 7/61* (2018.01)
*C09D 183/08* (2006.01)
*G02F 1/1333* (2006.01)
*G06F 1/16* (2006.01)
*H10K 50/84* (2023.01)
*H10K 59/12* (2023.01)
*C08K 3/36* (2006.01)
*C08K 7/18* (2006.01)

(52) U.S. Cl.
CPC ............... *C03C 17/30* (2013.01); *C09D 7/61* (2018.01); *C09D 7/67* (2018.01); *C09D 7/70* (2018.01); *G02B 1/11* (2013.01); *G02F 1/133305* (2013.01); *G02F 1/133331* (2021.01); *G06F 1/1652* (2013.01); *H10K 50/84* (2023.02); *H10K 59/12* (2023.02); *C03C 2217/445* (2013.01); *C03C 2217/465* (2013.01); *C03C 2217/478* (2013.01); *C03C 2217/73* (2013.01); *C03C 2217/732* (2013.01); *C03C 2218/112* (2013.01); *C08K 3/36* (2013.01); *C08K 7/18* (2013.01); *C08K 2201/011* (2013.01); *G06F 1/1626* (2013.01); *Y10T 428/24777* (2015.01)

(58) Field of Classification Search
CPC ............ C09D 5/16–165; G06F 1/1652; G06F 1/1333; G06F 1/133302; G06F 1/133305; G06F 1/1626; G06F 1/1656
See application file for complete search history.

(56) References Cited

U.S. PATENT DOCUMENTS

| | | | |
|---|---|---|---|
| 9,951,229 B2 | 4/2018 | Cho et al. | |
| 10,605,960 B2 | 3/2020 | Kim et al. | |
| 10,678,081 B2 | 6/2020 | Inoue et al. | |
| 10,823,883 B2 | 11/2020 | Byun et al. | |
| 10,908,323 B2 | 2/2021 | Byun et al. | |
| 10,962,686 B2 | 3/2021 | Byun et al. | |
| 2006/0204655 A1* | 9/2006 | Takahashi | G02B 5/206 106/287.34 |
| 2008/0032053 A1* | 2/2008 | Kourtakis | C08K 5/0025 106/287.14 |
| 2009/0176084 A1* | 7/2009 | Yoshihara | G02B 1/111 427/372.2 |
| 2009/0214976 A1 | 8/2009 | Okaniwa et al. | |
| 2010/0271699 A1 | 10/2010 | Chang et al. | |
| 2012/0009429 A1* | 1/2012 | Shmueli | C09D 5/006 106/286.6 |
| 2012/0118628 A1* | 5/2012 | Pakula | G06F 1/1626 174/520 |
| 2012/0200933 A1* | 8/2012 | Akiyama | G02B 5/0247 359/601 |
| 2013/0071646 A1 | 3/2013 | Kim et al. | |
| 2013/0216820 A1* | 8/2013 | Riddle | C09D 5/002 427/407.1 |
| 2013/0250414 A1 | 9/2013 | Eguchi et al. | |
| 2014/0049827 A1* | 2/2014 | Fujii | G02B 1/113 359/586 |
| 2014/0106141 A1* | 4/2014 | Bellman | C03C 17/3417 427/490 |
| 2015/0037535 A1* | 2/2015 | Akimoto | G02B 1/005 427/508 |
| 2015/0037543 A1* | 2/2015 | Keegan | C03C 17/32 428/192 |
| 2015/0266272 A1 | 9/2015 | Lee et al. | |
| 2015/0274983 A1* | 10/2015 | Cho | G02B 1/111 523/218 |
| 2015/0301231 A1* | 10/2015 | Yang | G02B 1/14 428/313.9 |
| 2015/0323706 A1* | 11/2015 | Yang | C08J 7/0427 359/581 |
| 2016/0033042 A1* | 2/2016 | Minagawa | C10M 107/42 427/508 |
| 2016/0304722 A1* | 10/2016 | Kobori | G02B 1/118 |
| 2016/0340551 A1* | 11/2016 | Lin | G02B 1/111 |
| 2017/0058131 A1* | 3/2017 | Sigmund | C09D 183/08 |
| 2017/0123107 A1* | 5/2017 | Cho | C08G 77/22 |
| 2017/0341451 A1 | 11/2017 | Minamidate et al. | |
| 2018/0009997 A1* | 1/2018 | Bhagwagar | C09D 183/06 |
| 2018/0017713 A1* | 1/2018 | Byun | C08L 83/06 |
| 2018/0185875 A1* | 7/2018 | Murakami | B32B 17/10137 |
| 2019/0177574 A1* | 6/2019 | Takeda | C08G 77/54 |
| 2019/0194066 A1* | 6/2019 | Omote | H05K 5/03 |
| 2019/0227195 A1* | 7/2019 | Horio | G02B 5/22 |
| 2019/0308904 A1* | 10/2019 | Koep | C09D 133/08 |
| 2019/0341409 A1* | 11/2019 | Yamabi | H01L 27/14645 |
| 2021/0277260 A1* | 9/2021 | Xu | C09D 7/65 |

FOREIGN PATENT DOCUMENTS

| | | |
|---|---|---|
| CN | 104755570 | 7/2015 |
| CN | 206431594 | 8/2017 |
| CN | 108025526 | 5/2018 |
| CN | 108885281 | 11/2018 |
| JP | 2003-502257 | 1/2003 |
| JP | 2007-182511 | 7/2007 |
| JP | 2007-316213 | 12/2007 |
| JP | 2010-282036 | 12/2010 |
| JP | 2011-088787 | 5/2011 |
| JP | 2011088787 A * | 5/2011 |
| KR | 10-0551135 | 2/2006 |
| KR | 10-2009-0049518 | 5/2009 |
| KR | 10-2011-0041747 | 4/2011 |
| KR | 10-1501682 | 3/2015 |
| KR | 10-2015-0108991 | 10/2015 |
| KR | 10-2017-0034557 | 3/2017 |
| KR | 10-2017-0113792 | 10/2017 |
| TW | 201410806 | 3/2014 |
| WO | 2017-208995 | 4/2019 |

OTHER PUBLICATIONS

Barthel et al., "Fumed Silica—Production, Properties, and Applications", Organosilicon Chemistry 11, 1996.*
Extended European Search Report dated Apr. 22, 2020, in European Patent Application No. 19214710.6.
Notice of Reasons for Refusal dated Apr. 20, 2023, issued to Japan Patent Application No. 2019-066350.

* cited by examiner

WINDOW, METHOD OF MANUFACTURING WINDOW, AND DISPLAY DEVICE INCLUDING WINDOW

CROSS-REFERENCE TO RELATED APPLICATION

This application claims priority from and the benefit of Korean Patent Application No. 10-2019-0000284, filed Jan. 2, 2019, which is hereby incorporated by reference for all purposes as if fully set forth herein.

BACKGROUND

Field

Exemplary embodiments generally relate to a window, a method of manufacturing a window, and a display device including a window.

Discussion

A variety of mobile electronic devices may use a display device including a liquid crystal display (LCD), an organic light-emitting diode (OLED) display, or the like, such as mobile phones, navigation systems, digital cameras, electronic books, portable game machines, various terminals, etc. A typical display device used in such mobile electronic devices may have a transparent cover window (hereinafter, a window), which is provided at the front of a display panel and through which a user can see an image. Since the window may be formed at the outermost position of the device, the window should be resistant to an external environment so as to protect the display panel of (e.g., inside) the display device. Further, instead of a conventional method in which a switch or keyboard is used as an input device, a structure employing a touch panel having a display screen integrated therewith are being implemented. As such, the surface of the window may be more frequently contacted with a finger or the like than mobile devices utilizing conventional input mechanisms.

The above information disclosed in this section is only for understanding the background of the inventive concepts, and, therefore, may contain information that does not form prior art.

SUMMARY

Some exemplary embodiments are capable of providing a window having a simple manufacturing process and a thin thickness.

Some exemplary embodiments are capable of providing a method of manufacturing a window with a thin thickness and a simple manufacturing process.

Some exemplary embodiments are capable of providing a display device including a window having a simple manufacturing process and a thin thickness.

Additional aspects will be set forth in the detailed description which follows, and, in part, will be apparent from the disclosure, or may be learned by practice of the inventive concepts.

According to some exemplary embodiments, a window includes a base layer and a first coating layer. The first coating layer is disposed on a first surface of the base layer. The first coating layer is a single layer. The first coating layer includes a siloxane-based compound. The siloxane-based compound includes fluorine and silica.

According to some exemplary embodiments, a display device includes a display panel and a window. The window includes a base layer and a first coating layer. The first coating layer is disposed on the base layer. The first coating layer is a single layer. The first coating layer includes porous silica and fumed silica.

According to some exemplary embodiments, a method of manufacturing a window includes preparing a base layer of the window; and forming, via a wet coating process, a first coating layer on a first surface of the base layer. The first coating layer is formed of a single layer. The first coating layer includes at least two of porous silica, fumed silica, and a siloxane-based compound. The siloxane-based compound includes fluorine.

According to various exemplary embodiments, a process of manufacturing a window is simplified, and, as such, not only may manufacturing time be reduced, but so too may manufacturing costs. In addition, anti-reflection, anti-glare, and anti-fingerprint functions may be provided by the window, e.g., a surface of the window.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
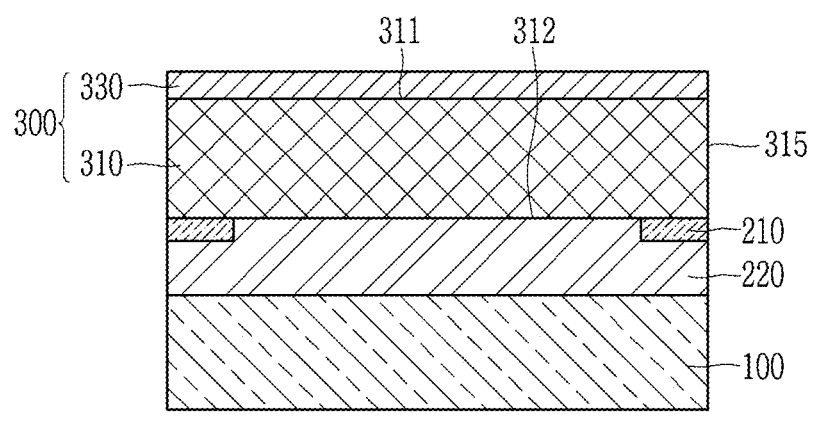
FIG. 1 is a schematic cross-sectional view of a display device according to some exemplary embodiments.

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the X-axis, the Y-axis, and the Z-axis are not limited to three axes of a rectangular coordinate system, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly. Further, for the purposes of this disclosure, the phrase "on a plane" means viewing the object portion from the top, and the phrase "on (or in) a cross-section" means viewing a cross-section of which the object portion is vertically cut from a side.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

Figure 2:
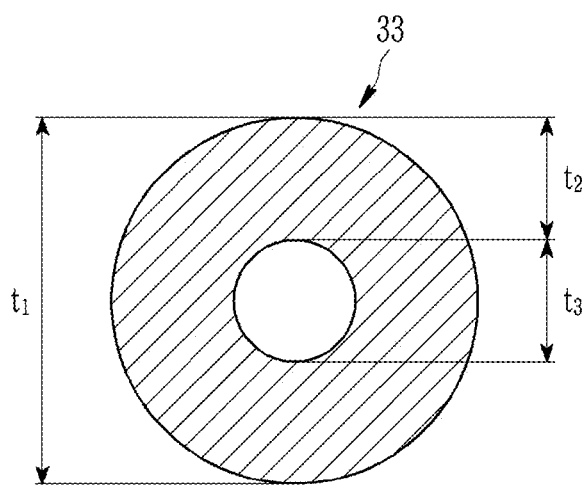
FIG. 2 is a schematic cross-sectional view of porous silica according to some exemplary embodiments.

Now, a display device according to some exemplary embodiments is described with reference to FIGS. 1 and 2. FIG. 1 is a schematic cross-sectional view of a display device according to some exemplary embodiments. FIG. 2 is a schematic cross-sectional view of porous silica according to some exemplary embodiments.

As shown in FIG. 1, the display device according to some exemplary embodiments includes a display panel 100 and a window 300 disposed on the display panel 100. An adhesive layer 220 adhering the display panel 100 and the window 300 is disposed between the display panel 100 and the window 300.

The display panel 100 may be flexible, stretchable, foldable, bendable, rollable, and/or otherwise deformable. Hereinafter, the terms flexible, stretchable, foldable, bendable, rollable, and/or otherwise deformable will be individually and/or collectively referred to as flexible. The display panel 100 may have flexibility such that it can be bent, but the display panel 100 is not limited thereto. For instance, the display panel 100 may be flat or include at least one flat portion and at least one flexible portion without limitation.

The display panel 100 may be an organic light-emitting display (OLED) panel. Although not shown, the display panel 100 may at least include a substrate, a plurality of thin film transistors disposed on the substrate, and a plurality of electrodes.

Although the display panel 100 has been described as being an OLED panel, exemplary embodiments are not limited thereto. According to some exemplary embodiments, the display panel 100 may be at least one of a liquid crystal display panel (LCD), a quantum dot organic light-emitting display panel (QD-OLED), an inorganic light-emitting display panel, a quantum dot liquid crystal display panel (QD-LCD), a quantum nano-emitting display panel (QNED), a micro light-emitting display panel, an electrophoretic display panel, an electrowetting display panel, and the like.

The adhesive layer 220 is positioned between the display panel 100 and the window 300. The adhesive layer 220 combines (or otherwise couples) the display panel 100 and the window 300. The adhesive layer 220 may be a transparent polymer resin layer, and for example, may include at least one of an optically clear adhesive (OCA), an optically clear resin (OCR), a pressure sensitive adhesive (PSA), and a super view resin (SVR), but exemplary embodiments are not limited thereto.

A light blocking layer 210 may be disposed between the adhesive layer 220 and the window 300. The light blocking layer 210 may include a material capable of blocking and/or absorbing light. The light blocking layer 210 may be disposed to correspond to a bezel region of the display device according to some exemplary embodiments. According to some exemplary embodiments, the light blocking layer 210 may be omitted.

The window 300 is disposed on the display panel 100, and may be attached to the display panel 100 by the adhesive layer 220. The window 300 may protect the display panel 100 from the outside, e.g., protect the display panel 100 from dust, debris, moisture, impact, etc.

The window 300 according to some exemplary embodiments includes a base layer 310 and a first coating layer 330.

The base layer 310 may have a plate shape. The base layer 310 may be a glass substrate or a plastic substrate according to some exemplary embodiments. For descriptive and illustrative convenience, the configuration of the base layer 310 is composed of a single layer, but the base layer 310 may be formed of a plurality of layers.

The base layer 310 may include, for example, a glass material including a silicate. The glass material may further contain (or include) an additional material to provide durability, surface smoothness, and transparency. For example, base layer 310 may include at least of one aluminosilicates, borosilicates, boro-aluminosilicates, and the like. The base layer 310 may further include at least one of an alkali metal, an alkaline earth metal, and an oxide thereof. It is contemplated, however, that exemplary embodiments are not limited to the aforementioned materials for the base layer 310.

The base layer 310 may include a first surface 311 facing the first coating layer 330, and a second surface 312 facing the display panel 100. Also, the base layer 310 includes a vertical surface 315 that is perpendicular to the first surface 311 and the second surface 312.

The first coating layer 330 is disposed on the outer surface of the window 300. The first coating layer 330 may overlap the first surface 311 of the base layer 310. The first coating layer 330 may be in direct contact with the first surface 311 of the base layer 310, but exemplary embodiments are not limited thereto. The first coating layer 330 may be disposed on the first surface 311 on which a user's touch is directly performed. The first coating layer 330 may have at least one of an anti-glare, anti-reflective, and anti-fingerprint characteristic or function for preventing (or reducing) at least fingerprints from appearing on the window 300.

The first coating layer 330 may be a single layer. The first coating layer 330 may provide the effects of the anti-glare, the anti-reflective, and/or the anti-fingerprint characteristics through one layer.

The first coating layer 330 may include at least two of a siloxane-based compound containing fluorine, porous silica, and fumed silica. The first coating layer 330 may include a siloxane-based compound containing fluorine and porous silica, a siloxane-based compound containing fluorine and fumed silica, porous silica and fumed silica, and/or a siloxane-based compound containing fluorine, porous silica, and fumed silica.

The first coating layer 330 may include a cured body of a first solution (or compound). The first solution may include at least two among the siloxane-based compound containing fluorine, porous silica, and fumed silica. The first solution may include the siloxane-based compound containing fluorine and porous silica, the siloxane-based compound containing fluorine and fumed silica, porous silica and fumed silica, or the siloxane-based compound containing fluorine, porous silica, and fumed silica.

The siloxane-based compound containing fluorine may include, for example, heptadecafluorodecyltrimethoxysilane, tridecafluorooctyltriethoxysilane, or heptadecafluorodecyl triisopropoxysilane. The siloxane-based compound containing fluorine may be included in an amount ranging from about 4 weight percent (wt %) to about 7 wt % for the entire content in the first solution. When the content of the siloxane-based compound containing fluorine is out of the above-described content, it may be difficult to simultaneously achieve the anti-glare, anti-reflection, and anti-fingerprint effects of the window 300. Also, the siloxane-based compound containing fluorine may be included in an amount of about 5 wt % to about 6 wt %, e.g., about 4 wt % to about 5 wt %, for instance about 6 wt % to about 7 wt %, for example, about 4.5 wt % to about 6.5 wt %.

According to some exemplary embodiments, the first coating layer 330 containing the siloxane-based compound containing fluorine may provide the anti-fingerprint effect to the window 300. A contact angle for the first coating layer 330 may increase by the siloxane-based compound containing fluorine.

In some exemplary embodiments, the porous silica may include, for example, silicon dioxide. The porous silica may be included within the range of about 4 wt % to about 7 wt % for the entire content of the first solution. If the content of the porous silica is out of the above-described content, it may be difficult to simultaneously achieve the anti-glare, anti-reflection, and anti-fingerprint effects of the window 300. Also, the porous silica may be included within the range of about 5 wt % to about 6 wt %, e.g., about 4 wt % to about 5 wt %, for instance about 6 wt % to about 7 wt %, for example, about 4.5 wt % to about 6.5 wt %.

The porous silica 33, as shown in FIG. 2, may include hollows. The porous silica 33 has a shape having empty spaces formed therein. For instance, the porous silica 33 may be formed in an annular configuration, but exemplary embodiments are not limited thereto.

The diameter t1 of the porous silica 33 may be from about 50 nm to about 100 nm, e.g., about 70 nm to about 80 nm, such as about 50 nm to about 70 nm, for instance, about 75 nm to about 100 nm, for example, about 60 nm to about 75 nm. The diameter t3 of the hollow included in the porous silica 33 may be from about 30 nm to about 60 nm, such as about 40 nm to about 50 nm, e.g., about 30 nm to about 45 nm, for instance, about 45 nm to about 60 nm, for example, about 45 nm to about 55 nm. The thickness t2 of the shell surrounding the hollow may be from about 10 nm to about 30 nm, such as about 15 nm to about 25 nm, e.g., about 20 nm to about 30 nm, for instance, about 10 nm to about 25 nm, for example, about 20 nm to about 25 nm.

According to some exemplary embodiments, the first coating layer 330 containing porous silica may have the effect (or function) of preventing the reflection by (or form) external light. The surface reflectance of the first coating layer 330 including the porous silica may be greater than 0 and less than about 2.5% and may be greater than 0 and less than about 1.3% according to exemplary embodiments.

The fumed silica according to some exemplary embodiments may include, for example, amorphous fumed silica. The fumed silica may be included in an amount from about 0.1 wt % to about 0.5 wt % for the entire content of the first solution, e.g., about 0.2 wt % to about 0.4 wt %, such as about 0.1 wt % to about 0.3 wt %, for instance, about 0.3 wt % to about 0.5 wt %, for example, about 0.25 wt % to about 0.35 wt %. If the content of the fumed silica is out of the above-described content, it may be difficult to simultaneously achieve the anti-glare, anti-reflection, and anti-fingerprint effects of the window 300.

The diameter of the fumed silica may be from about 5 nm to about 10 nm, e.g., about 6 nm to about 9 nm, such as about 5 nm to about 8 nm, for instance, about 7 nm to about 10 nm, for example, about 7 nm to about 8 nm.

According to some exemplary embodiments, the first coating layer 330 containing the fumed silica may have the effect of preventing glare. The gloss of the window 300, including the first coating layer 330 including the fumed silica, may be from about 100 gloss units (GU) to about 120 GU, e.g., 105 GU to about 115 GU, such as 110 GU to about 120 GU, for instance, 100 GU to about 115 GU, for example, 108 GU to about 112 GU.

Also, the first solution may contain at least one of an epoxy silane, an acid catalyst, and a solvent.

The epoxy silane may include, for example, a trimethoxy silane. The epoxy silane may be included in an amount ranging from about 3 wt % to about 5 wt % for the entire content of the first solution, e.g., about 3.5 wt % to about 4.5 wt %, such as about 3 wt % to about 4 wt %., for instance, about 4 wt % to about 5 wt %, for example, about 3.8 wt % to about 4.2 wt %.

The acid catalyst, for example, may include benzene tetracarboxylic anhydride. The acid catalyst may be included in an amount from about 0.1 wt % to about 0.5 wt % for the entire content of the first solution, e.g., about 0.2 wt % to about 0.4 wt %, such as about 0.1 wt % to about 0.3 wt %, for instance, about 0.3 wt % to about 0.5 wt %, for example, about 0.25 wt % to about 0.35 wt %.

The first solution may contain a residual solvent, and the residual solvent may be, for example, propylene glycol methyl ether.

The viscosity of the first solution may be from about 1.0 centipoise (cps) to about 5.0 cps, e.g., about 2.0 cps to about 4.0 cps, such as about 1.0 cps to about 3.5 cps, for instance, about 3 cps to about 5.0 cps, for example, about 2.5 cps to about 3.5 cps.

The first coating layer 330 may be formed on the base layer 310 by using a wet coating method. The first coating layer 330 may be formed using a slip coater, a bar coater, a spin coater, a spray coater, and/or the like, for example. For instance, the first coating solution may be coated on the base layer 310 using the spray coater, and the coated solution may be cured at 180° C. to 200° C. for 30 minutes to form the first coating layer 330. If the first coating layer 330 is formed using a dry coating method, a deposition distance deviation may occur depending on a height deviation of the base layer 310 provided during the manufacturing process. As such, a dry coating method formed first coating layer may not be formed uniformly and a color distortion due to the dry coating formed first coating layer may occur.

However, when the first coating layer 330 is formed using the wet coating method, according to some exemplary embodiments, the first coating layer 330 may be uniformly formed on the base layer 310. Since the color distortion caused by the window 300 may be reduced, an excellent (or at least improved) quality display device may be provided.

The first coating layer 330 according to some exemplary embodiments may include the fumed silica, the porous silica, and the siloxane-based compound containing fluorine, which are contained in one layer. The first coating layer 330 according to some exemplary embodiments can have a variety of effects through the single layer, which may provide the window 300 with a simple manufacturing process and excellent quality.

Figure 3:
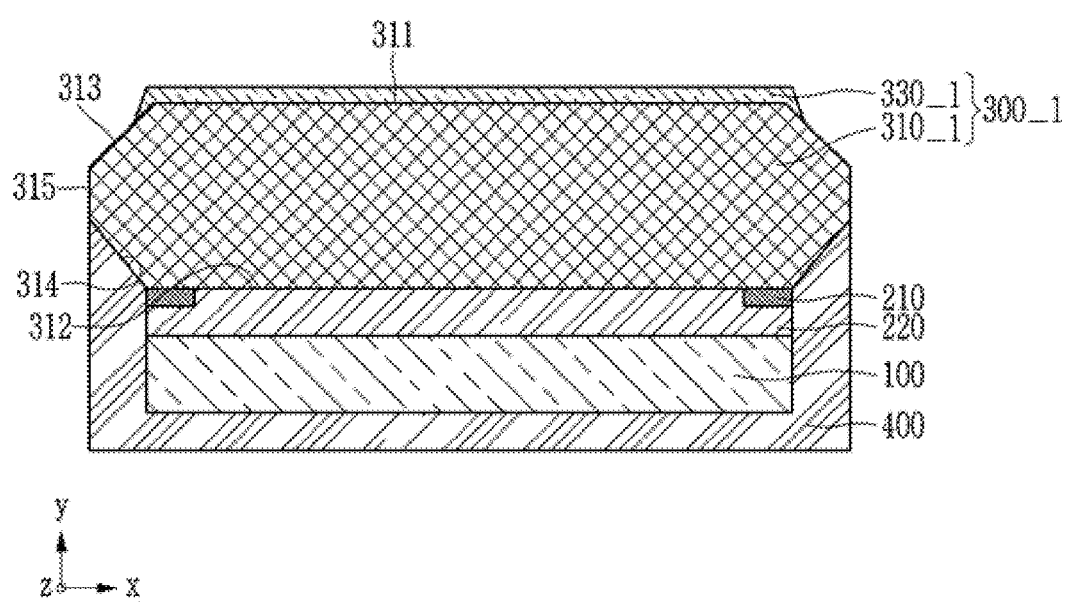
FIG. 3 is a schematic cross-sectional view of a display device according to some exemplary embodiments.

Next, a display device according to some exemplary embodiments is described with reference to FIG. 3. FIG. 3 is a schematic cross-sectional view of a display device according to some exemplary embodiments. The description of the same configurations as the above-described configurations is omitted.

The display device according to some exemplary embodiments may include a housing 400 surrounding the display panel 100 and the window 300_1. The housing 400 is not limited to the illustrated form, and may have any form surrounding the display panel 100 and the window 300.

The window 300_1 according to some exemplary embodiments includes the base layer 310_1 and the first coating layer 330_1.

The base layer 310_1 may be a glass substrate or a plastic substrate. The base layer 310_1 may include, for example, a glass material including a silicate. The glass material may further contain an additional material to provide durability, surface smoothness, and transparency. For example, the base layer 310_1 may include at least one of aluminosilicates, borosilicates, boro-aluminosilicates, and the like. The base layer 310_1 may further include at least one of an alkali metal, an alkali earth metal, and an oxide thereof, but exemplary embodiments are not limited to the above-mentioned materials.

According to some exemplary embodiments, the base layer 310_1 includes the first surface 311 facing the first coating layer 330, the second surface 312 facing the display panel 100, and the vertical surface 315 perpendicular to the first surface 311 and the second surface 312. The first surface 311 is a surface facing the user (or first coating layer 330_1), and the second surface 312 is a surface facing the display panel 100 and overlapping the light blocking layer 210 and the adhesive layer 220.

The base layer 310_1 may include a first inclination surface 313 that is inclined with respect to the first surface 311, e.g., inclined at an angle greater than 0° and less than 90°. The first inclination surface 313 connects the first surface 311 and the vertical surface 315. The base layer 310_1 may include a second inclination surface 314 that is inclined with respect to the second surface 312, e.g., inclined at an angle greater than 0° and less than 90°. The second inclination surface 314 connects the second surface 312 and the vertical surface 315.

The first coating layer 330_1 may overlap the first surface 311 of the base layer 310. Also, the first coating layer 330_1 may overlap with a portion of the first inclination surface 313, but exemplary embodiments are not limited thereto.

The first coating layer 330_1 may have an inclined shape along one side of the base layer 310_1, for example, along the first inclination surface 313 of the base layer 310_1. The first coating layer 330_1 may be formed of a solution having a predetermined viscosity. In the process of coating and curing the solution, the end of the first coating layer 330_1 may have a tapered shape toward one side of the base layer 310_1. The thickness of the end of the first coating layer 330_1 may be reduced toward the first inclination surface 313 of the base layer 310.

Figure 4:
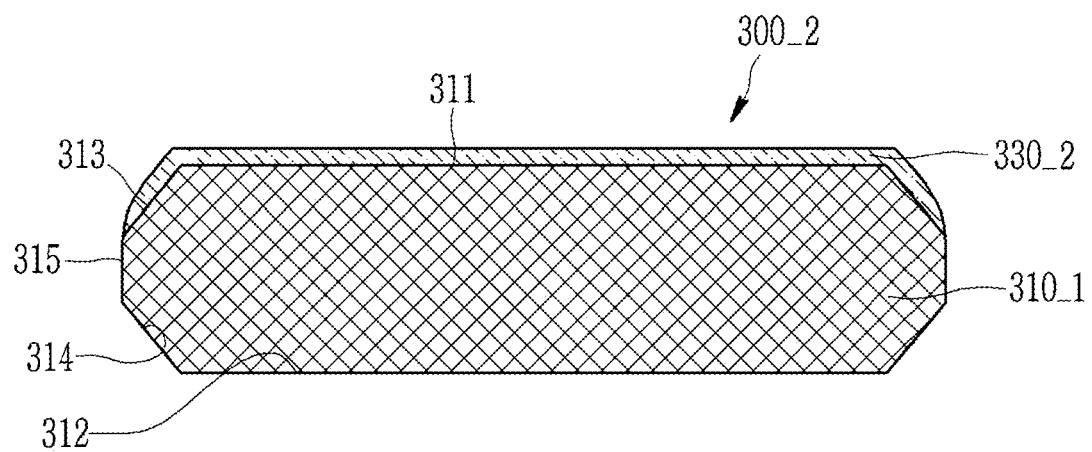
FIGS. 4, 5, and 6 are cross-sectional views of a window according to various exemplary embodiments.
Figure 5:
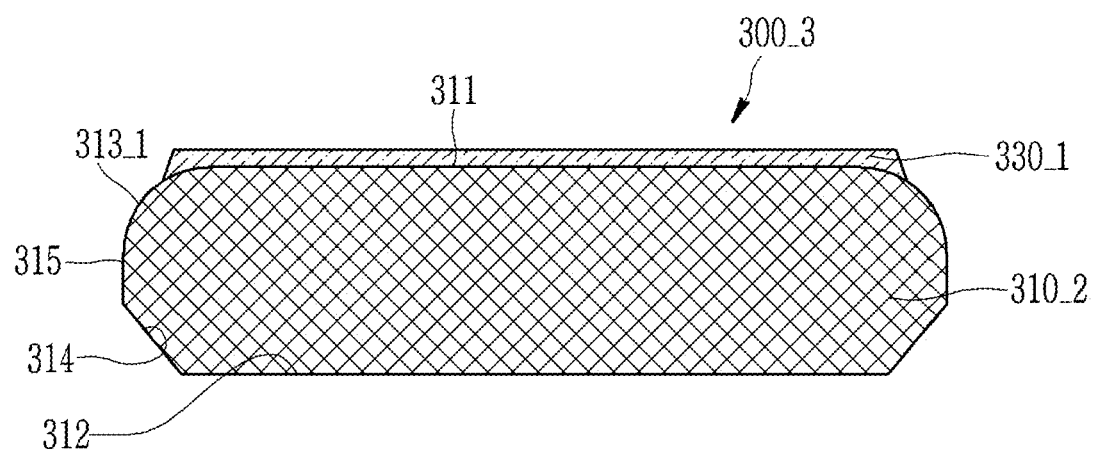
Figure 5:
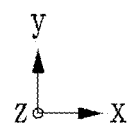
Figure 6:
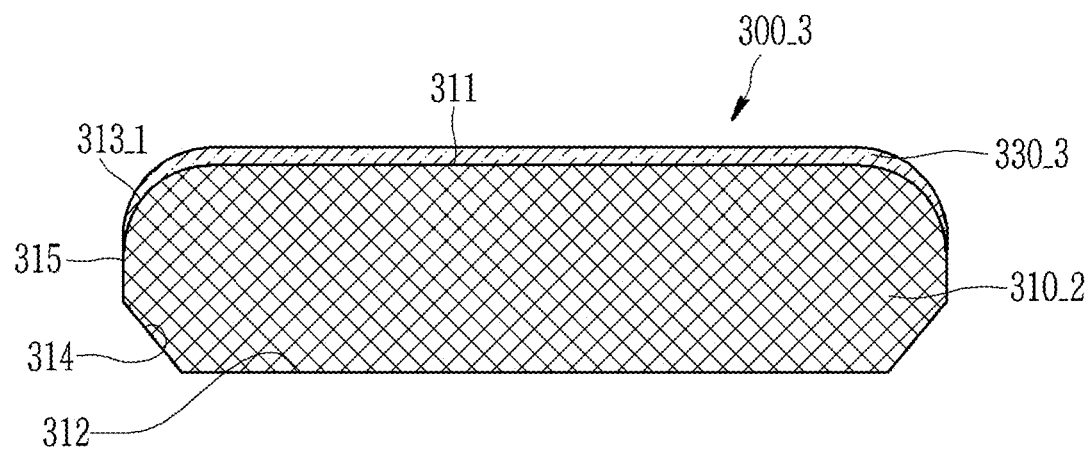

Next, a display device according to some exemplary embodiments is described with reference to FIGS. 4 to 6. FIGS. 4, 5, and 6 are cross-sectional views of a window according to various exemplary embodiments. The description of the same components as the above-described components is omitted.

First, referring to FIG. 4, the end of the first coating layer 330_2 may have an inclined shape along the first inclination surface 313. The first coating layer 330_2 may be formed of the solution having a predetermined viscosity. In the process of coating and curing the solution, the end of the first coating layer 330_2 may have a tapered shape toward one side of the base layer 310_1. The thickness of the end of the first coating layer 330_2 may be reduced toward the first inclination surface 313 of the base layer 310_1.

Also, the end of the first coating layer 330_2 may be aligned with the end of the first inclination surface 313. However, exemplary embodiments are not limited thereto. For instance, the first coating layer 330_2 may completely cover the first inclination surface 313 and the end thereof may be disposed on the vertical surface 315.

Next, referring to FIG. 5, the first inclination surface 313_1 connecting the first surface 311 and the vertical surface 315 of the base layer 310_2 may include a curved surface of a convex shape. Although the first inclination surface 313_1 having the curved surface of the convex shape has been described, exemplary embodiments are not limited thereto. For instance, the shape of the first inclination surface 313_1 may include any shape having the curved surface of a concave shape or having a curvature. The first coating layer 330_1 may partially overlap the first inclination surface 313_1 of the convex shape. For example, the end of the first coating layer 330_1 may overlap the first inclination surface 313 of the convex shape.

Referring to FIG. 6, the first inclination surface 313_1 connecting the first surface 311 of the base layer 310_2 and the vertical surface 315 may include the curved surface of the convex shape.

The end of the first coating layer 330_3 may have the inclined shape along the first inclination surface 313_1. The first coating layer 330_3 may be formed of the solution having the predetermined viscosity. In the process of coating and curing the solution, the end of the first coating layer 330_3 may have the tapered shape toward one side of the base layer 310_2. The thickness of the end of the first coating layer 330_3 may be reduced toward the first inclination surface 313 of the base layer 310_2.

The first coating layer 330_3 may overlap the first inclination surface 313_1 of the convex shape. The first coating layer 330_3 may completely cover the first inclination surface 313_1 of the convex shape according to some exemplary embodiments. The end of the first coating layer 330_3 may be aligned with the end of the first inclination surface 313_1, but exemplary embodiments are not limited thereto. For instance, the end of the first coating layer 330_3 may be disposed on the vertical surface 315.

Figure 7:
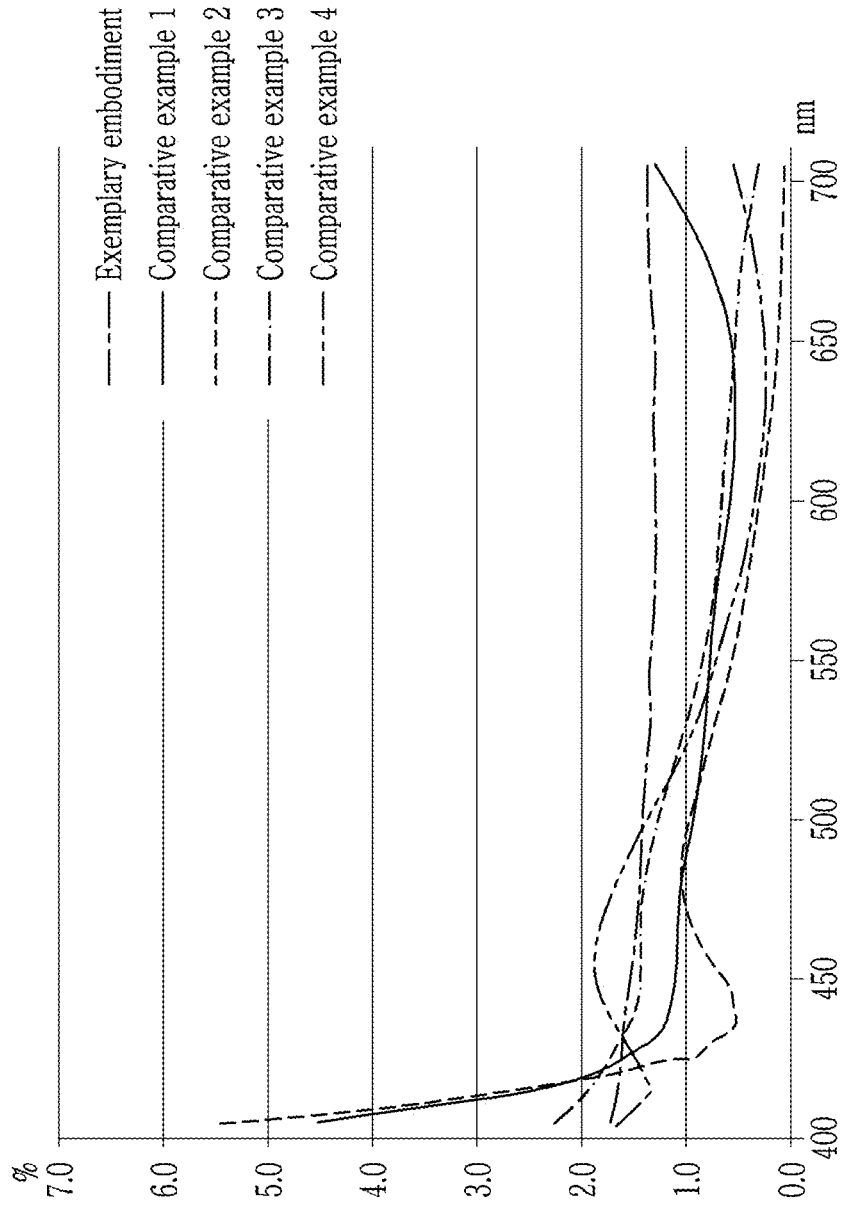
FIG. 7 is a graph showing reflectance of a comparative example and according to some exemplary embodiments.
Figure 8:
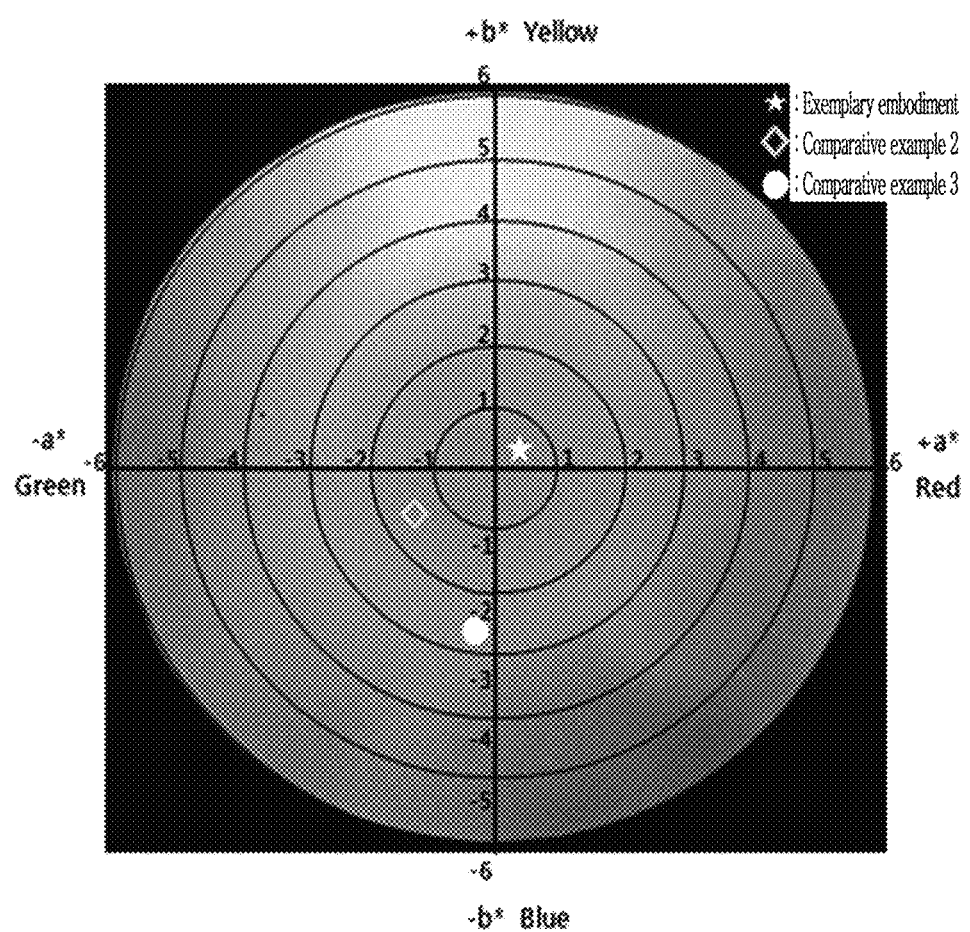
FIG. 8 is an image showing color coordinates of a comparative example and according to some exemplary embodiments.

Next, an exemplary embodiment and a comparative example are described with reference to FIGS. 7 and 8. FIG. 7 is a graph showing reflectance of a comparative example and according to some exemplary embodiments. FIG. 8 is an image showing color coordinates of a comparative example and according to some exemplary embodiments.

Referring to FIG. 7, the exemplary embodiment is a window including a base layer and a first coating layer consisting of one layer, and Comparative Example 1 to Comparative Example 4 show windows separately including a base layer, a surface-treatment layer for the anti-glare, an anti-reflective coating layer, and an anti-fingerprint coating layer. Comparative Example 1 to Comparative Example 4 include the same surface-treatment layer and coating layer, but the thickness or performance of the base layer is different.

As shown in FIG. 7, it may be confirmed that the exemplary embodiment exhibits almost constant reflectance (about 1.3% to about 1.7%) in the entire wavelength region of about 400 nm to about 700 nm. The window according to the exemplary embodiment exhibits uniform reflectance over the entire wavelength region such that there is no distortion of the provided color and the reflection reduction effect of the external light may be excellent.

On the other hand, in the case of Comparative Example 1 to Comparative Example 4, a reflectance difference of about 5% is observed depending on the wavelength. In this case, some wavelengths may be excessively reflected compared to other wavelengths, and, as such, the distortion may occur in the color of the light provided to the user.

Referring to FIG. 8, it may be confirmed that the exemplary embodiment has closer color coordinates to a color coordinate center. In other words, it is confirmed that the color purity of the exemplary embodiment is superior to that of the comparative examples.

For example, referring to FIG. 8 and Table 1 below, the color coordinates (a*, b*) according to the exemplary embodiment may be 0.45 and 0.11, and thus, the appearance of the window represents a neutral color. On the other hand, in the case of Comparative Example 2, the color coordinates may be −1.55 and −1.55, and as shown in FIG. 8, the appearance represents a light blue color. In case of Comparative Example 3, it may be confirmed that the appearance also represents the light blue color through FIG. 8. On the other hand, the color coordinates of the Comparative Example 5 may be −0.07 and −2.06, and it may be confirmed that the appearance represents a light purple color. Comparative Example 5 includes the same surface-treatment layer and coating layer as that of the above-described Comparative Example 1 to Comparative Example 4, but the base layer of the window is different. It is noted that Comparative Example 5 is not illustrated in FIG. 8, but provided in Table 1.

TABLE 1

| | Gloss (GU) | Surface Reflection (%) | Appearance | Contact Angle (Degrees) | Surface Hardness |
|---|---|---|---|---|---|
| Exemplary Embodiment | 104.8 | 1.31 | Neutral | 120.6 | 5H |
| Comparative Example 2 | 94.5 | 0.51 | Light Blue | 119.0 | 5-6H |
| Comparative Example 5 | 101.2 | 0.71 | Light Purple | 114.5 | 5-6H |

Also, it is confirmed that the gloss according to the exemplary embodiment is about 104.8 GU, the gloss according to Comparative Example 2 is about 94.5 GU, and the gloss according to Comparative Example 5 is about 101.2 GU. It may be confirmed that even if only one layer is included according to the exemplary embodiment, sufficient gloss is obtained. In addition, it is confirmed that the surface reflection, the contact angle, and the surface hardness in the exemplary embodiment are similar to those in the comparative example. Compared with the comparative example separately including the anti-reflection layer, the anti-fingerprint layer, and the like, it is confirmed that the exemplary embodiment including only one layer also has the sufficient reflection preventing effect, surface hardness, and fingerprint preventing effect (the contact angle).

Figure 9:
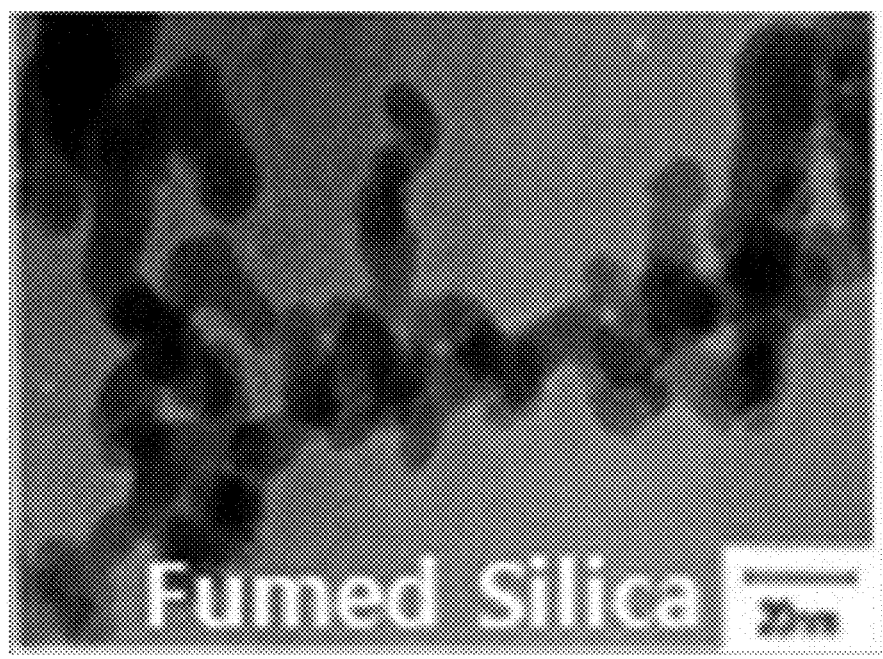
FIG. 9 is an image of fumed silica according to some exemplary embodiments.
Figure 10:
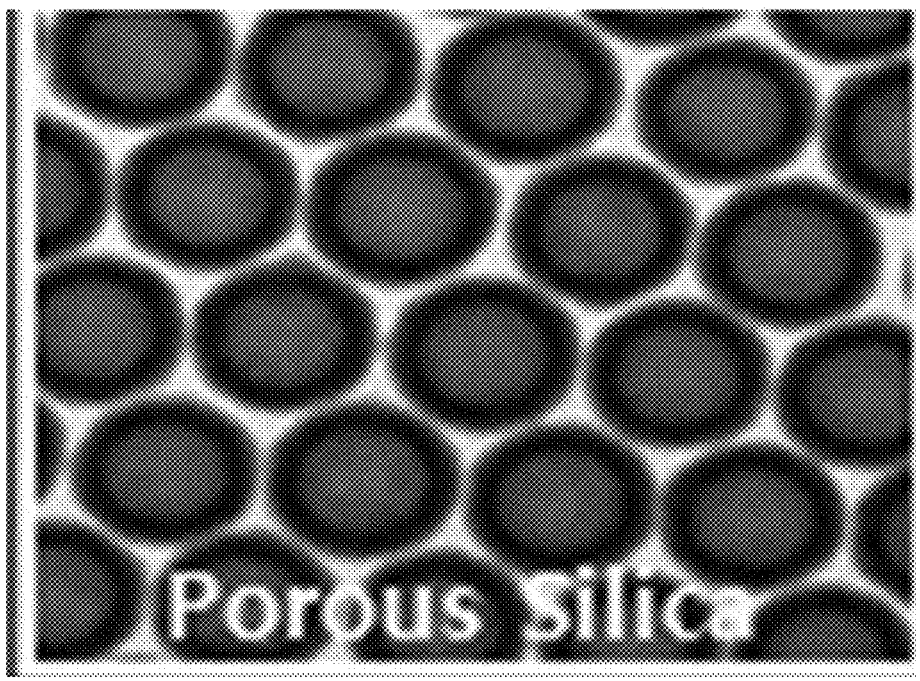
FIG. 10 is an image of porous silica according to some exemplary embodiments.

Next, the material included in the first coating layer according to some exemplary embodiments is described with reference to FIGS. 9 and 10. FIG. 9 is an image of fumed silica according to some exemplary embodiments. FIG. 10 is an image of porous silica according to some exemplary embodiments.

Referring to FIG. 9, it may be confirmed that the fumed silica according to some exemplary embodiments has the diameter of about 5 nm to about 10 nm. Also, referring to FIG. 10, it may be confirmed that the porous silica according to some exemplary embodiments has a spherical shape including the hollow.

On the other hand, when the anti-glare treatment is separately performed like in at least one of the comparative examples, and the anti-reflection layer and the anti-fingerprint layer are separately included, the manufacturing cost for the manufacturing process may be considerably increased. According, however, to various exemplary embodiments, a manufacturing cost may be about one sixth of that of at least one of the comparative examples such that it may be excellent in terms of a manufacturing cost reduction.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A window comprising:
a base layer; and
a first coating layer disposed on a first surface of the base layer,
wherein:
the first coating layer is a single layer;
the first coating layer comprises fumed silica, porous silica, and a siloxane-based compound;
the siloxane-based compound comprises fluorine, the content of the porous silica being in a range of about 8 times to about 70 times the content of the fumed silica;
the base layer and the first coating layer are in direct contact;
the siloxane-based compound does not contain any cured product formed by curing a respective (meth) acrylate containing precursor; and
for all wavelength within a wavelength domain of about 400 nm to about 700 nm, the window exhibits a corresponding reflectance of about 1.3% to about 1.7%.

2. The window of claim 1, wherein:
the porous silica comprises a hollow; and
a diameter of the hollow is from about 30 nm to about 60 nm.

3. The window of claim 2, wherein a thickness of a shell surrounding the hollow is from about 10 nm to about 30 nm.

4. The window of claim 1, wherein the fumed silica is amorphous fumed silica.

5. The window of claim 1, wherein a diameter of the fumed silica is from about 5 nm to about 10 nm.

6. The window of claim 1, wherein an end portion of the first coating layer is inclined along one surface of the base layer.

7. The window of claim 1, wherein the base layer comprises:
a second surface overlapping the first surface;
a vertical surface perpendicular to the first surface and the second surface;
a first inclination surface connecting the first surface and the vertical surface; and a second inclination surface connecting the second surface and the vertical surface.

8. The window of claim 7, wherein the first coating layer overlaps the first inclination surface.

9. The window of claim 7, wherein the first inclination surface is a curved surface.

10. The window of claim 1, wherein the first coating layer comprises a cured body formed from a first solution, and the porous silica is in the range of about 4 weight percent to about 7 weight percent of the first solution and the siloxane-based compound is in the range of about 4 weight percent to about 7 weight percent of the first solution.

11. The window of claim 10, wherein the fumed silica is in the range of about 0.1 weight percent to about 0.5 weight percent of the first solution.

12. The window of claim 1, wherein the first coating layer is a single, cured layer formed from a solution comprising at least one of tridecafluorooctyltriethoxysilane and heptadecafluorodecyl triisopropoxysilane.

13. The window of claim 12, wherein:
the porous silica comprises a hollow; and
a diameter of the hollow is from about 30 nm to about 60 nm.

14. The window of claim 13, wherein a thickness of a shell surrounding the hollow is from about 10 nm to about 30 nm.

15. The window of claim 12, wherein the fumed silica is amorphous fumed silica.

16. The window of claim 12, wherein a diameter of the fumed silica is from about 5 nm to about 10 nm.

17. The window of claim 12, wherein an end portion of the first coating layer is inclined along one surface of the base layer.

18. The window of claim 12, wherein the base layer comprises:
a second surface overlapping the first surface;
a vertical surface perpendicular to the first surface and the second surface;
a first inclination surface connecting the first surface and the vertical surface; and
a second inclination surface connecting the second surface and the vertical surface.

19. The window of claim 18, wherein the first coating layer overlaps the first inclination surface.

20. The window of claim 18, wherein the first inclination surface is a curved surface.

21. A display device comprising:
a display panel; and
a window overlapping the display panel,
wherein the window comprises:
a base layer; and
a first coating layer disposed on the base layer, wherein:
the first coating layer is a single layer;
the first coating layer comprises fumed silica, porous silica, and a siloxane-based compound;
the siloxane-based compound comprises fluorine, the content of the porous silica being in a range of about 8 times to about 70 times the content of the fumed silica;
the base layer and the first coating layer are in direct contact;
the siloxane-based compound does not contain any cured product formed by curing a respective (meth) acrylate containing precursor; and
for all wavelength within a wavelength domain of about 400 nm to about 700 nm, the window exhibits a corresponding reflectance of about 1.3% to about 1.7%.

22. The display device of claim 21, wherein:
the porous silica comprises a hollow;
a diameter of the hollow is from about 30 nm to about 60 nm; and
a thickness of a shell surrounding the hollow is from about 10 nm to about 30 nm.

23. The display device of claim 21, wherein a diameter of the fumed silica is from about 5 nm to about 10 nm.

24. The display device of claim 21, wherein an end portion of the first coating layer is inclined along one surface of the base layer.

25. The display device of claim 21, wherein the base layer comprises:
a second surface overlapping a first surface and facing the display panel;
a vertical surface perpendicular to the first surface and the second surface;
a first inclination surface connecting the first surface and the vertical surface; and
a second inclination surface connecting the second surface and the vertical surface.

26. The display device of claim 25, wherein the first coating layer overlaps the first inclination surface.

27. The display device of claim 25, wherein the first inclination surface is a curved surface.

28. A method for manufacturing the window according to claim 1, comprising preparing the base layer of the window; and
forming, via a wet coating process, the first coating layer on the first surface of the base layer.

29. The method of claim 28, wherein the wet coating process is a spray process.

* * * * *